United States Patent
Kimura et al.

(10) Patent No.: US 11,742,223 B2
(45) Date of Patent: Aug. 29, 2023

(54) SUBSTRATE PROCESSING APPARATUS

(71) Applicant: Tokyo Electron Limited, Tokyo (JP)

(72) Inventors: Yuji Kimura, Koshi (JP); Yoshihiro Kai, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 300 days.

(21) Appl. No.: 16/737,027

(22) Filed: Jan. 8, 2020

(65) Prior Publication Data

US 2020/0227290 A1 Jul. 16, 2020

(30) Foreign Application Priority Data

Jan. 10, 2019 (JP) .................................. 2019-002793

(51) Int. Cl.
*H01L 21/67* (2006.01)
*H01L 21/687* (2006.01)
*H01L 21/677* (2006.01)

(52) U.S. Cl.
CPC .. *H01L 21/67086* (2013.01); *H01L 21/67057* (2013.01); *H01L 21/67742* (2013.01); *H01L 21/68771* (2013.01)

(58) Field of Classification Search
None
See application file for complete search history.

(56) References Cited

U.S. PATENT DOCUMENTS

| | | | | |
|---|---|---|---|---|
| 4,559,664 A | * | 12/1985 | Bohme | B08B 3/02 15/302 |
| 4,877,493 A | * | 10/1989 | Yamato | C25D 7/04 205/159 |
| 5,236,515 A | * | 8/1993 | Ueno | H01L 21/67017 134/25.4 |
| 5,503,171 A | * | 4/1996 | Yokomizo | H01L 21/67057 134/182 |
| 2006/0213542 A1 | * | 9/2006 | Abiko | B08B 3/04 134/61 |

(Continued)

FOREIGN PATENT DOCUMENTS

| | | |
|---|---|---|
| JP | 2006-032641 A | 2/2006 |
| JP | 2007-324567 A | 12/2007 |
| JP | 2013251383 A * | 12/2013 |
| JP | 2017069529 A * | 4/2017 ....... H01L 21/02307 |

(Continued)

OTHER PUBLICATIONS

Machine Generated English Translation of Bib of JP2017069529. Published Apr. 6, 2017 (Year: 2017).*

(Continued)

*Primary Examiner* — Sylvia MacArthur
(74) *Attorney, Agent, or Firm* — Pearne & Gordon LLP

(57) ABSTRACT

A substrate processing apparatus comprises a processing tub and a fluid supply. In the processing tub, a processing is performed on multiple substrates by immersing the multiple substrates in a processing liquid. The fluid supply is disposed under the multiple substrates within the processing tub and configured to discharge a fluid to generate a liquid flow of the processing liquid within the processing tub. Further, the fluid supply includes multiple discharge paths configured to discharge the fluid to different regions in an arrangement direction of the multiple substrates.

14 Claims, 11 Drawing Sheets

(56) References Cited

U.S. PATENT DOCUMENTS

| | | | | |
|---|---|---|---|---|
| 2007/0240743 | A1* | 10/2007 | Hiroe | H01L 21/67017 134/94.1 |
| 2012/0240958 | A1* | 9/2012 | Higuchi | B08B 3/04 134/10 |
| 2015/0197861 | A1* | 7/2015 | Tice | H01L 21/68771 156/345.23 |
| 2018/0025927 | A1* | 1/2018 | Masutomi | H01L 21/67051 438/704 |
| 2018/0218924 | A1* | 8/2018 | Tanaka | H01L 21/67757 |
| 2019/0080937 | A1* | 3/2019 | Tsuchiya | H01L 21/67057 |
| 2019/0148176 | A1* | 5/2019 | Tanaka | H01L 21/6708 156/345.11 |
| 2019/0259639 | A1* | 8/2019 | Nakaoka | H01L 21/67313 |
| 2020/0211865 | A1* | 7/2020 | Otsu | H01L 21/67051 |
| 2020/0227290 | A1* | 7/2020 | Kimura | H01L 21/67057 |

FOREIGN PATENT DOCUMENTS

| | | |
|---|---|---|
| JP | 2018-014470 A | 1/2018 |
| JP | 2018-174258 A | 11/2018 |
| KR | 10-2003-0056702 A | 7/2003 |

OTHER PUBLICATIONS

Machine Generated English Translation of description of JP2017069529. Published Apr. 6, 2017 (Year: 2017).*

Machine Generated English Translation of claims of JP2017069529. Published Apr. 6, 2017 (Year: 2017).*

Machine Generated English Translation of the Bib data of JP2013-251383. Published Dec. 12, 2013 (Year: 2013).*

Machine Generated English Translation of the description of JP2013-251383. Published Dec. 12, 2013 (Year: 2013).*

* cited by examiner

SUBSTRATE PROCESSING APPARATUS

CROSS-REFERENCE TO RELATED APPLICATION

This application claims the benefit of Japanese Patent Application No. 2019-002793 filed on Jan. 10, 2019, the entire disclosure of which is incorporated herein by reference.

TECHNICAL FIELD

The exemplary embodiments described herein pertain generally to a substrate processing apparatus.

BACKGROUND

Conventionally, there is known a substrate processing apparatus configured to process a plurality of substrates for a lot all at once by immersing the lot in a processing tub in which a processing liquid is stored.

In this substrate processing apparatus, for the purpose of uniformity in a substrate processing, a gas supply configured to supply a gas such as a nitrogen gas may be provided within the processing tub to generate a liquid flow within the processing tub (see Patent Document 1).

Patent Document 1: Japanese Patent Laid-open Publication No. 2018-174258

SUMMARY

A substrate processing apparatus comprises a processing tub and a fluid supply. In the processing tub, a processing is performed on multiple substrates by immersing the multiple substrates in a processing liquid. The fluid supply is disposed under the multiple substrates within the processing tub and configured to discharge a fluid to generate a liquid flow of the processing liquid within the processing tub. Further, the fluid supply includes multiple discharge paths configured to discharge the fluid to different regions in an arrangement direction of the multiple substrates.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

In the detailed description that follows, exemplary embodiments are described as illustrations only since various changes and modifications will become apparent to those skilled in the art from the following detailed description. The use of the same reference numbers in different figures indicates similar or identical items.

DETAILED DESCRIPTION

Figure 1:
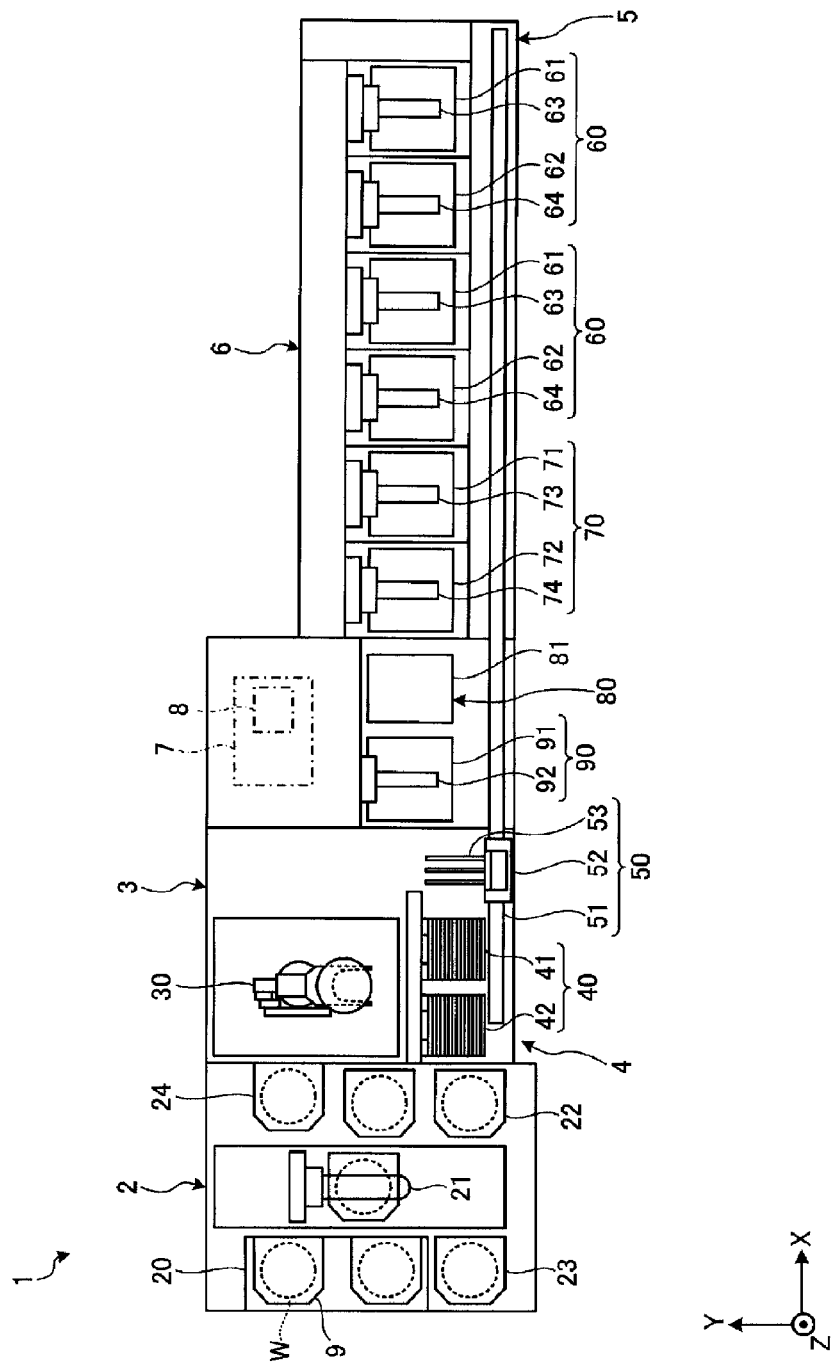
FIG. 1 is a plan view of a substrate processing apparatus according to a first exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other exemplary embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of a substrate processing apparatus according to the present disclosure (hereinafter, referred to as "exemplary embodiments") will be described in detail with reference to the accompanying drawings. Further, the substrate processing apparatus according to the present disclosure is not limited to the exemplary embodiments. The exemplary embodiments can be appropriately combined as long as processing contents are not contradictory to each other. Further, in each of the exemplary embodiments described below, same parts will be assigned same reference numerals, and redundant description will be omitted.

Further, in each of the accompanying drawings, for the purpose of clear understanding, there may be used a rectangular coordinate system in which the X-axis direction, Y-axis direction and Z-axis direction which are orthogonal to one another are defined and the positive Z-axis direction is defined as a vertically upward direction.

There is known a substrate processing apparatus configured to process a plurality of substrates for a lot all at once by immersing the lot in a processing tub in which a processing liquid is stored.

In this substrate processing apparatus, for the purpose of uniformity in a substrate processing, a gas supply configured to supply a gas such as a nitrogen gas may be provided within the processing tub to generate a liquid flow within the processing tub. Specifically, in the conventional substrate processing apparatus, the gas supply provided with a plurality of discharge openings disposed along an arrangement direction of the plurality of substrates is placed on a bottom portion of the processing tub, and discharges a gas through the discharge openings at the same flow rate to generate a uniform liquid flow within the processing tub.

However, even if the gas is uniformly discharged as described above, the liquid flow generated within the processing tub can be locally biased. For example, a plurality of substrates in a lot is spaced apart from each other at intervals. In this case, a certain interval may be supplied with much gas so that the liquid flow can be sufficiently generated therein, but another interval may be supplied with little gas so that the liquid flow can be insufficiently generated therein. Accordingly, it is required to generate an appropriate liquid flow within the processing tub.

First Exemplary Embodiment

<Configuration of Substrate Processing Apparatus>

First, a configuration of a substrate processing apparatus according to a first exemplary embodiment will be described with reference to FIG. 1. FIG. 1 is a plan view of a substrate processing apparatus 1 according to the first exemplary embodiment.

As illustrated in FIG. 1, the substrate processing apparatus 1 according to the first exemplary embodiment includes a carrier carry-in/out unit 2, a lot forming unit 3, a lot placing unit 4, a lot transferring unit 5, a lot processing unit 6 and a controller 7.

The carrier carry-in/out unit 2 is equipped with a carrier stage 20, a carrier transfer mechanism 21, carrier stocks 22 and 23, and a carrier placing table 24.

The carrier stage 20 places a plurality of carriers 9 transferred from the outside. Each of the carriers 9 is a container configured to accommodate a plurality (e.g., twenty five sheets) of wafers W vertically arranged in a horizontal posture. The carrier transfer mechanism 21 transfers each of the carriers 9 between the carrier stage 20, the carrier stocks 22 and 23 and the carrier placing table 24.

A plurality of wafers W before being processed is carried out from the carrier 9 placed on the carrier placing table 24 to the lot processing unit 6 by a substrate transfer mechanism 30 to be described later. Further, a plurality of wafers W after being processed is carried into the carrier 9 placed on the carrier placing table 24 from the lot processing unit 6 by the substrate transfer mechanism 30.

The lot forming unit 3 is equipped with the substrate transfer mechanism 30 to form a lot. The lot is formed of a plurality of (e.g., fifty sheets) of wafers W to be processed simultaneously by combining wafers W accommodated in one or more carriers 9. The wafers W in the lot is arranged with their plate surfaces facing each other at a predetermined interval.

The substrate transfer mechanism 30 transfers the wafers W between the carrier 9 placed on the carrier placing table 24 and the lot placing unit 4.

The lot placing unit 4 is equipped with a lot placing table 40 to temporarily place (stand by) a lot to be transferred between the lot forming unit 3 and the lot processing unit 6 by the lot transferring unit 5. The lot placing table 40 is equipped with a carry-in side lot placing table 41 on which a lot before being processed, which is formed by the lot forming unit 3, is placed; and a carry-out side lot placing table 42 on which a lot after being processed by the lot processing unit 6 is placed. On the carry-in side lot placing table 41 and the carry-out side lot placing table 42, the wafers W corresponding to a single lot is arranged side by side in an upright posture.

The lot transferring unit 5 is equipped with a lot transferring mechanism 50 to transfer the lot between the lot placing unit 4 and the lot processing unit 6 or within the lot processing unit 6. The lot transferring mechanism 50 is equipped with a rail 51, a moving body 52 and a substrate holder 53.

The rail 51 is placed along the lot placing unit 4 and the lot processing unit 6 in the X-axis direction. The moving body 52 is configured to be movable along the rail 51 while holding the wafers W. The substrate holder 53 is provided on the moving body 52 to hold the wafers W arranged side by side in the upright posture.

The lot processing unit 6 performs an etching processing, a cleansing processing, and a drying processing to the wafers W arranged side by side in the upright posture as a single lot. In the lot processing unit 6, two etching apparatuses 60, a cleaning apparatus 70, a substrate holder cleaning apparatus 80 and a drying apparatus 90 are provided along the rail 51.

The etching apparatus 60 is configured to perform the etching processing on the lot. The cleaning apparatus 70 is configured to perform the cleaning processing on the lot. The substrate holder cleaning apparatus 80 is configured to perform the cleaning processing on the substrate holder 53. The drying apparatus 90 is configured to perform the drying processing on the lot. Here, the numbers of the etching apparatuses 60, the cleaning apparatus 70, the substrate holder cleaning apparatus 80 and the drying apparatus 90 is not limited to the example illustrated in FIG. 1.

Each of the etching apparatuses 60 includes a processing tub 61 for etching, a processing tub 62 for rinsing, and substrate elevating devices 63 and 64.

The processing tub 61 can accommodate the wafers W for the single lot arranged in the upright posture, and store a processing liquid for etching (hereinafter, also referred to as "etching liquid") therein. Details of the processing tub 61 will be described below.

The processing tub 62 stores a processing liquid for rinsing (pure water or the like) therein. In each of the substrate elevating devices 63 and 64, the wafers W belonging to the lot is maintained as arranged side by side in the upright posture.

The etching apparatus 60 is configured to hold, with the substrate elevating device 63, the lot transferred by the lot transferring unit 5 and perform the etching processing by immersing the lot in the etching liquid in the processing tub 61. The etching processing is performed for, e.g., from about 1 hour to about 3 hours.

The lot after being etched in the processing tub 61 is transferred by the lot transferring unit 5 to the processing tub 62. Then, the etching apparatus 60 holds the transferred lot with the substrate elevating device 64 and performs the rinsing processing by immersing the lot in the rinsing liquid in the processing tub 62. The lot after being rinsed in the processing tub 62 is transferred by the lot transferring unit 5 to a processing tub 71 of the cleaning apparatus 70.

The cleaning apparatus 70 is equipped with the processing tub 71 for cleaning, a processing tub 72 for rinsing and substrate elevating devices 73 and 74. The processing tub 71 for cleaning stores a processing liquid for cleaning (e.g., SC-1 (a mixed solution of ammonia, hydrogen peroxide and water) or the like) therein.

The processing tub 72 for rinsing stores a processing liquid for rinsing (pure water or the like) therein. In each of the substrate elevating devices 73 and 74, the wafers W belonging to the lot is maintained as arranged side by side in the upright posture.

The cleaning apparatus 70 is configured to hold, with the substrate elevating device 73, the lot transferred by the lot transferring unit 5 and perform the cleaning processing by immersing the lot in the cleaning liquid in the processing tub 71.

The lot after being cleaned in the processing tub 71 is transferred by the lot transferring unit 5 to the processing tub 72. Then, the cleaning apparatus 70 is configured to hold the transferred lot with the substrate elevating device 74 and perform the rinsing processing by immersing the lot in the rinsing liquid in the processing tub 72. The lot after being rinsed in the processing tub 72 is transferred by the lot transferring unit 5 to a processing tub 91 of the drying apparatus 90.

The drying apparatus 90 is equipped with the processing tub 91 and a substrate elevating device 92. The processing tub 91 is supplied with a processing gas for drying (e.g., isopropyl alcohol (IPA) or the like). In the substrate elevating device 92, the wafers W belonging to the lot is maintained as arranged side by side in the upright posture.

The drying apparatus 90 is configured to hold, with the substrate elevating device 92, the lot transferred by the lot transferring unit 5 and perform the drying processing with the processing gas for drying supplied into the processing tub 91. The lot after being dried in the processing tub 91 is transferred by the lot transferring unit 5 to the lot placing unit 4.

The substrate holder cleaning apparatus 80 is configured to supply the processing liquid for cleaning to the substrate holder 53 of the lot transferring mechanism 50 and perform the cleaning processing on the substrate holder 53 by supplying the drying gas.

The controller 7 controls the operations of the respective units (the carrier carry-in/out unit 2, the lot forming unit 3, the lot placing unit 4, the lot transferring unit 5, the lot processing unit 6 and the like) of the substrate processing apparatus 1. The controller 7 controls the operations of the respective units of the substrate processing apparatus 1 based on signals from a switch or various sensors.

The controller 7 is, e.g., a computer, and includes a computer-readable storage medium 8. The storage medium 8 stores a program for controlling various processings that are executed in the substrate processing apparatus 1.

The controller 7 reads and executes the program stored in the storage medium 8 to control the operations of the substrate processing apparatus 1. Further, the program may be a program that has been stored in the computer-readable storage medium 8 and may be installed in the storage medium 8 of the controller 7 from the other storage medium.

Examples of the computer-readable storage medium 8 include a hard disc (HD), a flexible disc (FD), a compact disc (CD), a magnet optical disc (MO), and a memory card.

<Configuration of Processing Tub for Etching>

Figure 2:
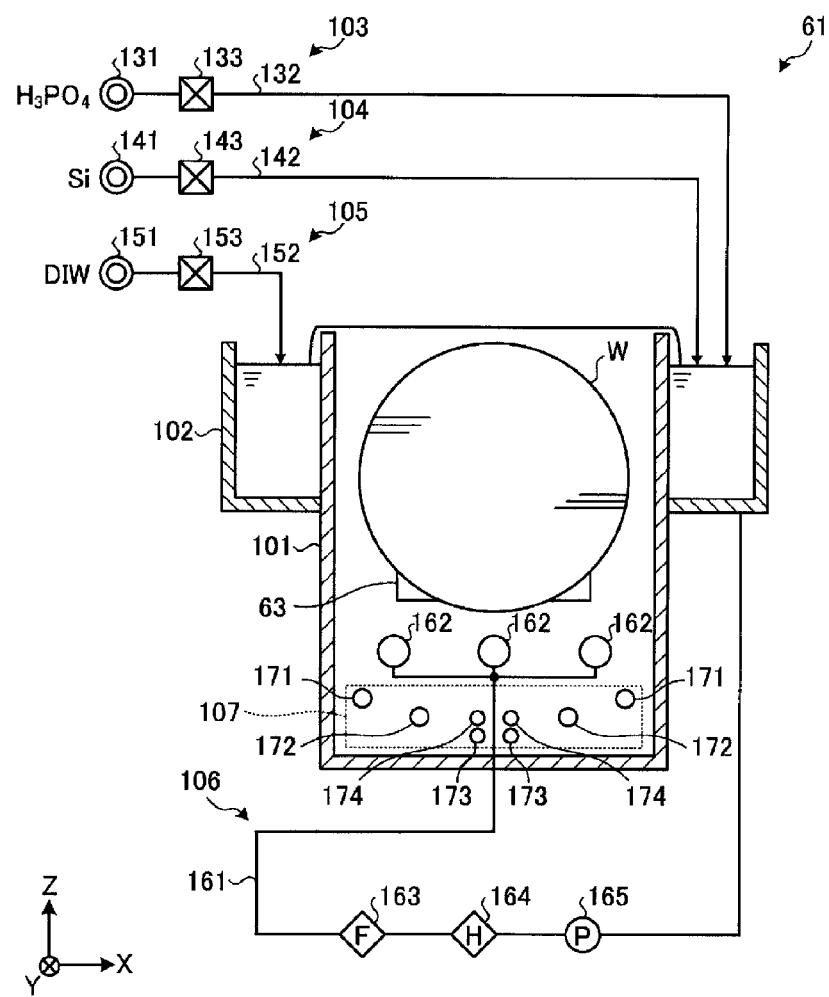
FIG. 2 is a block diagram illustrating a configuration of a processing tub for etching according to the first exemplary embodiment.

Hereinafter, the processing tub 61 for etching will be described with reference to FIG. 2. FIG. 2 is a block diagram illustrating a configuration of a processing tub 61 for etching according to the first exemplary embodiment.

In the processing tub 61, the etching processing of selectively etching a silicon nitride film (SiN) between the silicon nitride film and a silicon oxide film ($SiO_2$) formed on the wafer W with a predetermined etching liquid is performed. In the etching processing, a solution in which a silicon (Si)-containing compound is added to a phosphoric acid ($H_3PO_4$) aqueous solution to adjust the silicon concentration is used as the etching liquid.

As a method of adjusting the silicon concentration in the etching liquid, a method of immersing a dummy substrate in the phosphoric acid aqueous solution and dissolving silicon (seasoning) or a method of dissolving a silicon-containing compound, such as colloidal silica, in the phosphoric acid aqueous solution can be used. Otherwise, the silicon concentration may be adjusted by adding a silicon-containing compound aqueous solution into the phosphoric acid aqueous solution.

As illustrated in FIG. 2, the processing tub 61 for etching includes an inner tub 101 and an outer tub 102. The inner tub 101 is a box-shaped tub whose top is opened and stores the etching liquid therein. The lot formed of the wafers W is immersed in the inner tub 101. The outer tub 102 has an open top and is placed around an upper portion of the inner tub 101. The outer tub 102 is supplied with the etching liquid overflowing from the inner tub 101.

Further, the processing tub 61 includes a phosphoric acid aqueous solution supply 103, a silicon supply 104 and a DIW supply 105.

The phosphoric acid aqueous solution supply 103 includes a phosphoric acid aqueous solution source 131, a phosphoric acid aqueous solution supply line 132 and a flow rate controller 133.

The phosphoric acid aqueous solution source 131 is configured to supply the phosphoric acid aqueous solution in which phosphoric acid is concentrated to a desired concentration. The phosphoric acid aqueous solution supply line 132 connects the phosphoric acid aqueous solution source 131 and the outer tub 102 to supply the phosphoric acid aqueous solution from the phosphoric acid aqueous solution source 131 to the outer tub 102.

The flow rate controller 133 is provided at the phosphoric acid aqueous solution supply line 132 to control a supply amount of the phosphoric acid aqueous solution to be supplied to the outer tub 102. The flow rate controller 133 includes an opening/closing valve, a flow rate control valve, a flowmeter and the like.

The silicon supply 104 includes a silicon source 141, a silicon supply line 142, and a flow rate controller 143.

The silicon source 141 is a tank configured to store the silicon-containing compound aqueous solution. The silicon supply line 142 connects the silicon source 141 and the outer tub 102 to supply the silicon-containing compound aqueous solution from the silicon source 141 to the outer tub 102.

The flow rate controller 143 is provided at the silicon supply line 142 to control a supply amount of the silicon-containing compound aqueous solution to the outer tub 102. The flow rate controller 143 includes an opening/closing valve, a flow rate control valve, a flowmeter and the like. Since the supply amount of the silicon-containing compound aqueous solution is controlled by the flow rate controller 143, the silicon concentration in the etching liquid can be adjusted.

The DIW supply 105 includes a DIW source 151, a DIW supply line 152 and a flow rate controller 153. The DIW supply 105 is configured to supply the deionized water (DIW) to the outer tub 102 to replenish water vaporized by heating the etching liquid.

The DIW supply line 152 connects the DIW source 151 and the outer tub 102 to supply the DIW having a predetermined temperature from the DIW source 151 to the outer tub 102.

The flow rate controller 153 is provided at the DIW supply line 152 to control a supply amount of the DIW to the outer tub 102. The flow rate controller 153 includes an opening/closing valve, a flow rate control valve, a flowmeter and the like. Since the supply amount of the DIW is controlled by the flow rate controller 153, the temperature of the etching liquid and the phosphoric acid concentration and the silicon concentration in the etching liquid can be adjusted.

Furthermore, the processing tub 61 includes a circulation unit 106 and a gas supply 107. The circulation unit 106 circulates the etching liquid between the inner tub 101 and the outer tub 102. The circulation unit 106 includes a circulation line 161, a plurality of processing liquid supply nozzles 162, a filter 163, a heater 164, and a pump 165.

The circulation line 161 connects the outer tub 102 and the inner tub 101. One end of the circulation line 161 is connected to the outer tub 102 and the other end of the circulation line 161 is connected to the processing liquid supply nozzles 162 placed within the inner tub 101.

The filter 163, the heater 164 and the pump 165 are provided at the circulation line 161. The filter 163 is configured to remove impurities from the etching liquid flowing in the circulation line 161. The heater 164 is configured to heat the etching liquid flowing in the circulation line 161 to a temperature suitable for the etching processing. The pump 165 is configured to send the etching liquid within the outer tub 102 to the circulation line 161. The filter 163, the heater 164 and the pump 165 are provided in this sequence from the upstream side.

The circulation unit 106 is configured to supply the etching liquid from the outer tub 102 into the inner tub 101 via the circulation line 161 and the processing liquid supply nozzles 162. The etching liquid supplied into the inner tub 101 overflows from the inner tub 101 and flows back into the outer tub 102. Accordingly, the etching liquid circulates between the inner tub 101 and the outer tub 102.

Further, the circulation unit 106 may set the etching liquid in a boiling state by heating the etching liquid with the heater 164.

The gas supply 107 is placed within the inner tub 101. Specifically, the gas supply 107 is placed under the wafers W and the processing liquid supply nozzles 162. The gas supply 107 is configured to discharge a gas into the inner tub 101 to generate a liquid flow of the etching liquid within the inner tub 101.

<Configuration of Gas Supply>

Figure 3:
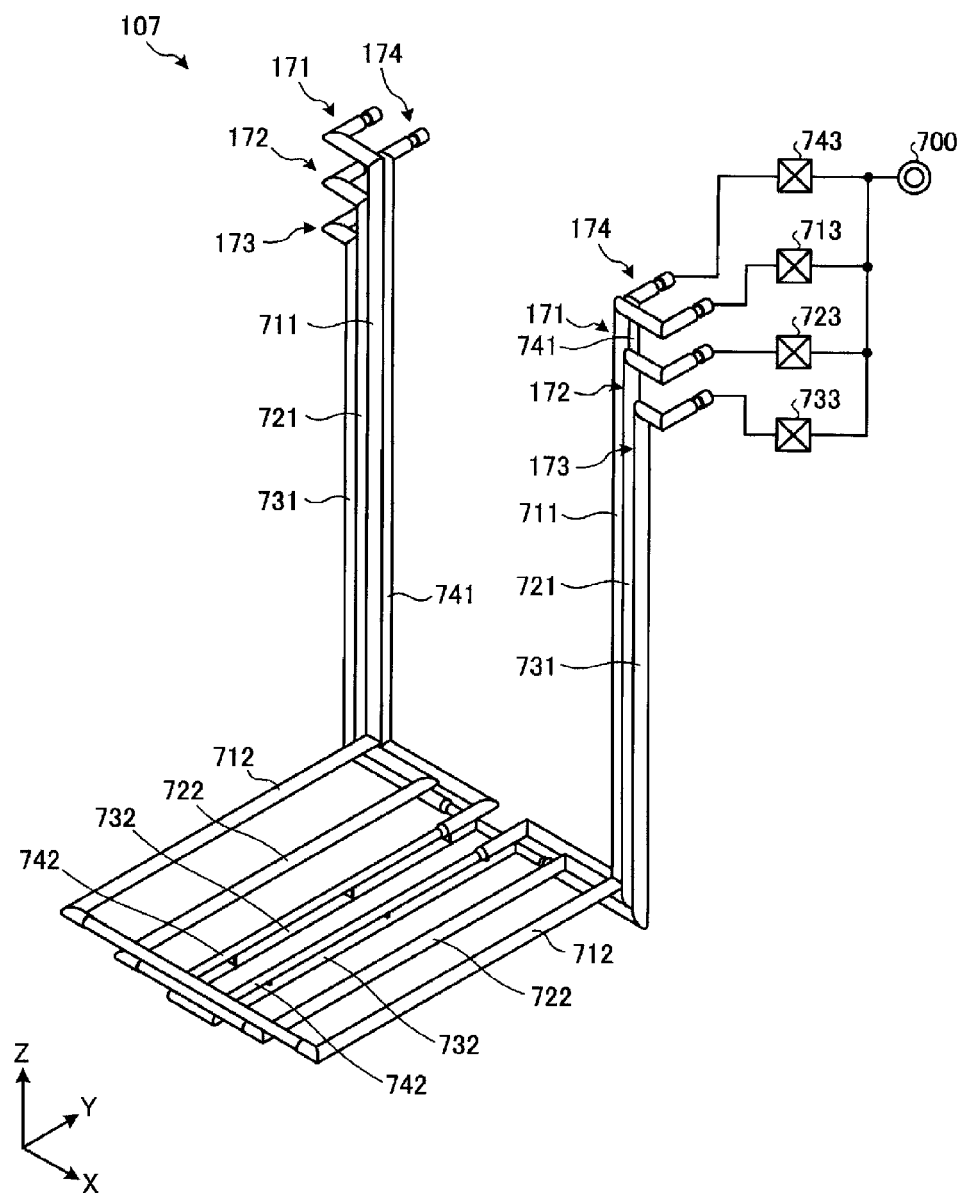
FIG. 3 is a perspective view of a gas supply according to the first exemplary embodiment.
Figure 4:
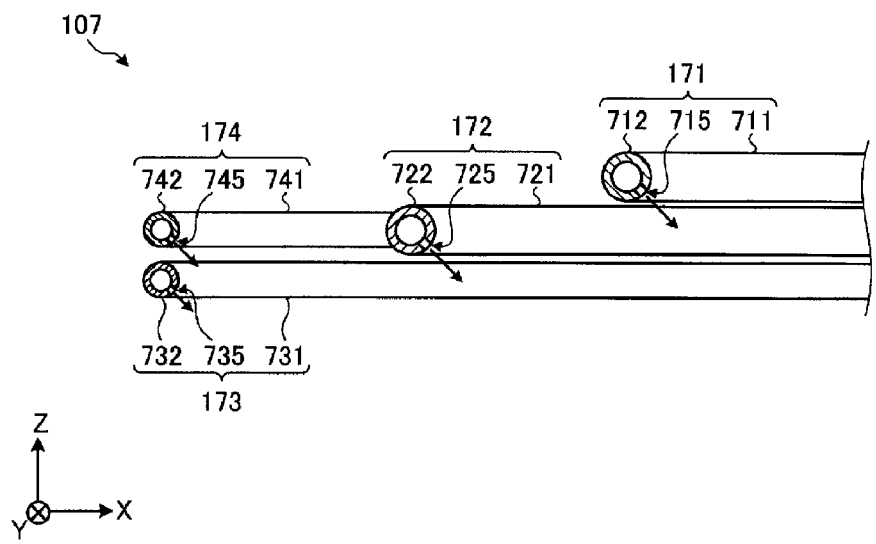
FIG. 4 is a cross-sectional view of the gas supply according to the first exemplary embodiment.
Figure 5:
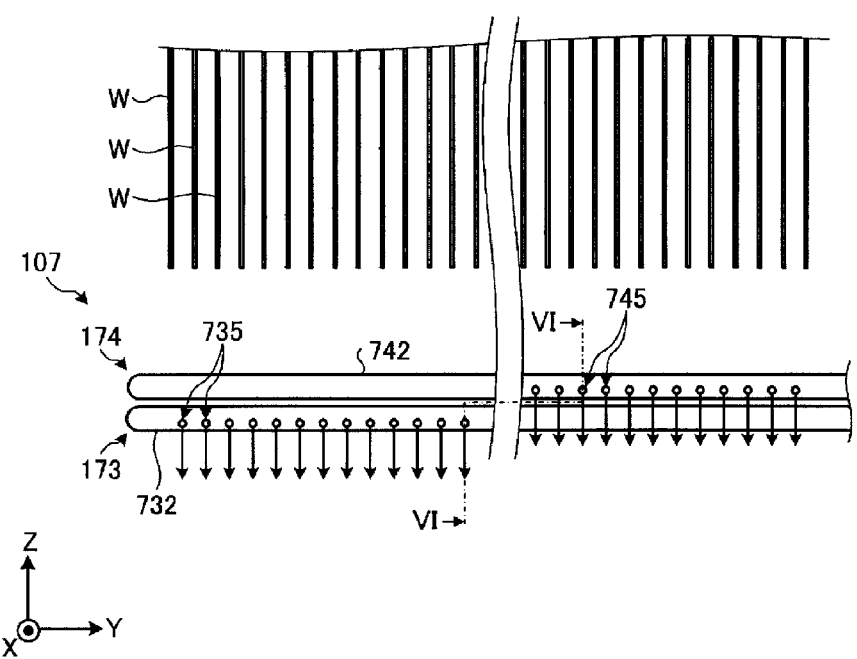
FIG. 5 is a side view of the gas supply according to the first exemplary embodiment.

Hereinafter, a configuration of the gas supply 107 according to the first exemplary embodiment will be described with reference to FIG. 3 to FIG. 5. FIG. 3 is a perspective view of the gas supply 107 according to the first exemplary embodiment. FIG. 4 is a cross-sectional view of the gas supply 107 according to the first exemplary embodiment. FIG. 5 is a side view of the gas supply 107 according to the first exemplary embodiment. FIG. 4 is the cross-sectional view as taken along a line VI-VI and viewed from a direction indicated by an arrow VI in FIG. 5. FIG. 5 is the side view of a third discharge path 173 and a fourth discharge path 174 of the gas supply 107 as viewed from the positive X-axis direction to the negative X-axis direction.

As illustrated in FIG. 3, the gas supply 107 includes a plurality of (here, eight) discharge paths as gas discharge paths. Specifically, the gas supply 107 includes two first discharge paths 171, two second discharge paths 172, two third discharge paths 173 and two fourth discharge paths 174.

The two first discharge paths 171 are placed to be axisymmetric with respect to a vertical line passing through a center of the wafer W as viewed from a direction facing the wafer W (the Y-axis direction in FIG. 2). Likewise, the two second discharge paths 172, the two third discharge paths 173 and the two fourth discharge paths 174 are placed to be axisymmetric with respect to the vertical line passing through the center of the wafer W.

Each of the two first discharge paths 171 includes a first extension portion 711 placed at the back side (positive Y-axis direction side) of the inner tub 101 and extending vertically; and a second extension portion 712 extending horizontally from a lower end of the first extension portion 711 toward the front side (negative Y-axis direction side) of the inner tub 101. The second extension portions 712 extends along an arrangement direction of the plurality of wafers W.

The two first extension portions 711 are connected to a gas source 700 via a flow rate controller 713. Herein, a gas supplied from the gas source 700 is a nitrogen gas. However, the gas supplied from the gas source 700 may be an inert gas (e.g., helium, argon or the like) other than the nitrogen gas or may be a gas other than the inert gas. The flow rate controller 713 is configured to control a flow rate of the nitrogen to be supplied to the first discharge paths 171. The flow rate controller 713 includes an opening/closing valve, a flow rate control valve, a flowmeter and the like.

Each of the two second discharge paths 172 includes a first extension portion 721 placed at the back side of the inner tub 101 and extending vertically; and a second extension portion 722 extending horizontally from a lower end of the first extension portion 721 toward the front side of the inner tub 101. The second extension portions 722 extends along the arrangement direction of the plurality of wafers W. Further, the second extension portions 722 are placed at an inner side in a diametrical direction of the wafer W than the second extension portions 712 of the first discharge paths 171.

The two first extension portions 721 are connected to the gas source 700 via a flow rate controller 723. The flow rate controller 723 is configured to control the flow rate of the nitrogen to be supplied to the second discharge paths 172. The flow rate controller 723 includes an opening/closing valve, a flow rate control valve, a flowmeter and the like.

Each of the two third discharge paths 173 includes a first extension portion 731 placed at the back side of the inner tub 101 and extending vertically; and a second extension portion 732 extending horizontally from a lower end of the first extension portion 731 toward the front side of the inner tub 101. The second extension portions 732 extends along the arrangement direction of the plurality of wafers W. Further, the second extension portions 732 are placed at the inner side in the diametrical direction of the wafer W than the second extension portions 722 of the second discharge paths 172.

The two first extension portions 731 are connected to the gas source 700 via a flow rate controller 733. The flow rate controller 733 is configured to control the flow rate of the nitrogen to be supplied to the third discharge paths 173. The flow rate controller 733 includes an opening/closing valve, a flow rate control valve, a flowmeter and the like.

Each of the two fourth discharge paths 174 includes a first extension portion 741 placed at the back side of the inner tub 101 and extending vertically; and a second extension portion 742 extending horizontally from a lower end of the first extension portion 741 toward the front side of the inner tub 101. The second extension portions 742 extends along the arrangement direction of the plurality of wafers W. Further, the second extension portions 742 are placed above the second extension portions 732 of the third discharge paths 173.

The two first extension portions 741 are connected to the gas source 700 via a flow rate controller 743. The flow rate controller 743 is configured to control the flow rate of the nitrogen to be supplied to the fourth discharge paths 174. The flow rate controller 743 includes an opening/closing valve, a flow rate control valve, a flowmeter and the like.

As illustrated in FIG. 4, the second extension portion 712 of the first discharge path 171 includes a plurality of discharge openings 715 (only one illustrated herein) along an extension direction of the second extension portion 712, i.e., the arrangement direction of the plurality of wafers W. The discharge openings 715 are located between the wafers W in the arrangement direction of the plurality of wafers W in order for the nitrogen from the gas supply 700 to be supplied between the wafers W.

The second extension portion 722 of the second discharge path 172 includes a plurality of discharge openings 725 (only one illustrated herein) along the extension direction of the second extension portion 722, i.e., the arrangement direction of the plurality of wafers W. The discharge openings 725 are located between the wafers W in the arrangement direction of the plurality of wafers W in order for the nitrogen from the gas supply 700 to be supplied between the wafers W.

The second extension portion 732 of the third discharge path 173 includes a plurality of discharge openings 735 (only one illustrated herein) along the extension direction of the second extension portion 732, i.e., the arrangement direction of the plurality of wafers W. The discharge openings 735 are located between the wafers W in the arrangement direction of the plurality of wafers W in order for the nitrogen from the gas supply 700 to be supplied between the wafers W.

The second extension portion 742 of the fourth discharge path 174 includes a plurality of discharge openings 745 (only one illustrated herein) along the extension direction of the second extension portion 742, i.e., the arrangement direction of the plurality of wafers W. The discharge openings 745 are located between the wafers W in the arrangement direction of the plurality of wafers W in order for the nitrogen from the gas supply 700 to be supplied between the wafers W.

The discharge openings 715, 725, 735 and 745 are provided in lower half parts of the respective cylindrical second extension portions 712, 722, 732 and 742. Thus, it is possible to suppress the etching liquid from being introduced into the second extension portions 712, 722, 732 and 742. Also, the discharge openings 715, 725, 735 and 745 are provided under side parts of the respective second extension portions 712, 722, 732 and 742 and above lower parts of the respective second extension portions 712, 722, 732 and 742. Accordingly, it is possible to allow the nitrogen to be discharged in the same direction, as compared with the case where the discharge openings 715, 725, 735 and 745 are provided in the lower parts of the respective second extension portions 712, 722, 732 and 742.

Both the plurality of discharge openings 715 provided in the first discharge path 171 and the plurality of discharge openings 725 provided in the second discharge path 172 are placed corresponding to all of intervals among the wafers W. That is, for example, if the lot is formed of 50 sheets of wafers W, forty nine (49) discharge openings 715 and forty nine (49) discharge openings 725 are provided in the first discharge path 171 and the second discharge path 172, respectively.

As illustrated in FIG. 5, the discharge openings 735 provided in the third discharge path 173 are placed corresponding to intervals of half the wafers W disposed at the front side of the processing tub 61. Also, the discharge openings 745 provided in the fourth discharge openings 174 are placed corresponding to intervals of half the wafers W disposed at the back side of the processing tub 61. Accordingly, half the wafers W at the front side of the processing tub 61 are supplied with the nitrogen from the third discharge path 173 and half the wafers W at the back side of the processing tub 61 are supplied with the nitrogen from the fourth discharge path 174.

As described above, the gas supply 107 according to the first exemplary embodiment includes the discharge paths, herein the third discharge path 173 and the fourth discharge path 174, configured to discharge the nitrogen to different regions in the arrangement direction of the plurality of wafers W. The third discharge path 173 and the fourth discharge path 174 are connected to different flow rate controllers 733 and 743, respectively and thus can individually control the discharge time and the flow rate of the nitrogen. For example, if a liquid flow is biased at the front side and at the back side of the processing tub 61, the controller 7 differentiates the discharge time and the flow rate of the nitrogen between the third discharge path 173 and the fourth discharge path 174 by controlling the flow rate controllers 733 and 743 and thus can suppress the bias of the liquid flow. The substrate processing apparatus 1 according to the first exemplary embodiment can generate a more appropriate liquid flow within the processing tub 61, as compared with the case where the nitrogen is discharged for the same discharge time at the same flow rate in the arrangement direction of the plurality of wafers W.

As illustrated in FIG. 4, inner diameters (flow path diameters) of the first extension portions 731 and 741 and the second extension portions 732 and 742 of the third and fourth discharge paths 173 and 174 are smaller than the first extension portions 711 and 721 and the second extension portions 712 and 722 of the first and second discharge paths 171 and 172. Accordingly, it is possible to allow a pressure loss of the first extension portions 731 and 741 and the second extension portions 732 and 742 to be higher than a pressure loss of the first extension portions 711 and 721 and the second extension portions 712 and 722. For this reason, the nitrogen can be discharged at a lower flow rate from the third discharge path 173 and the fourth discharge path 174. In other words, the minimum flow rate of the nitrogen from the third discharge path 173 and the fourth discharge path 174 can be set low. Therefore, it is possible to more precisely control the liquid flow of the etching liquid.

Modification Examples of Gas Supply

Figure 6:
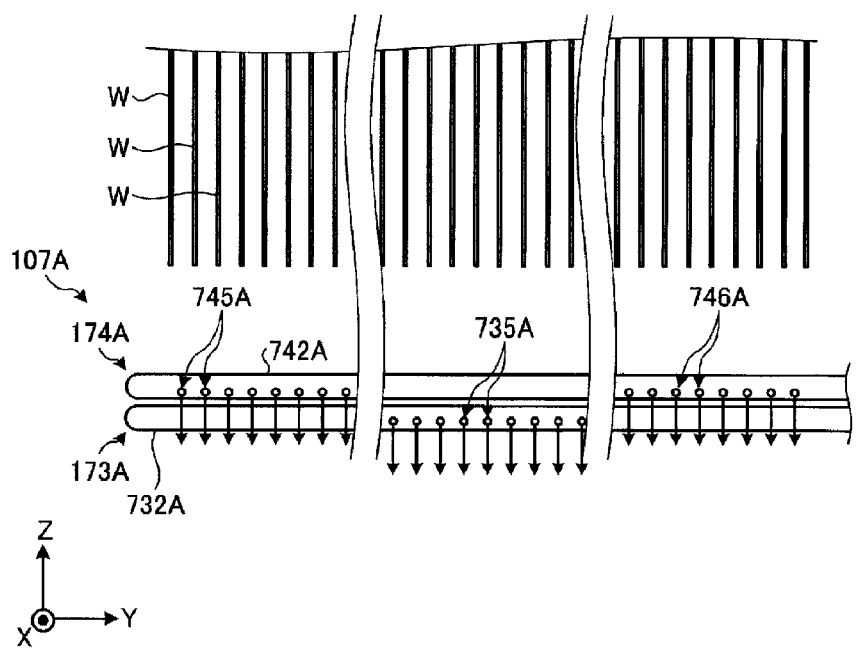
FIG. 6 is a side view of a gas supply according to a first modification example of the first exemplary embodiment.
Figure 7:
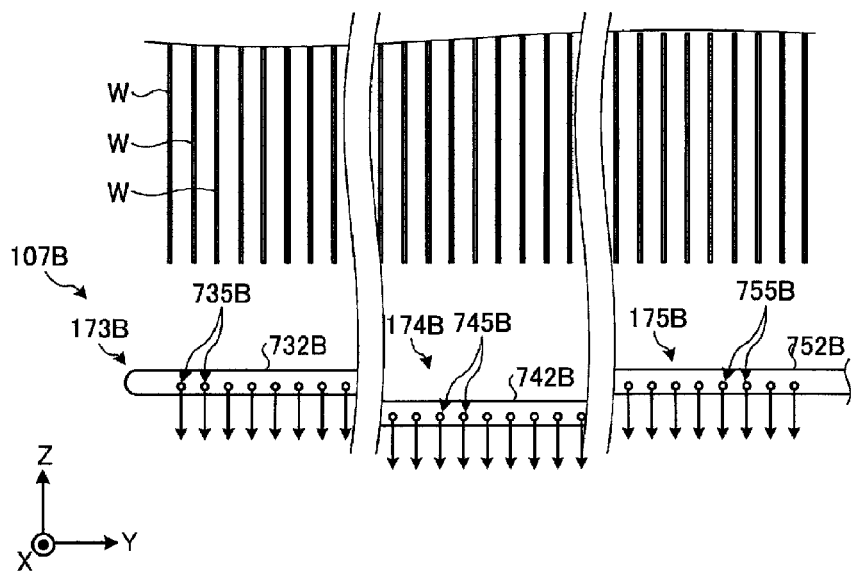
FIG. 7 is a side view of a gas supply according to a second modification example of the first exemplary embodiment.
Figure 8:
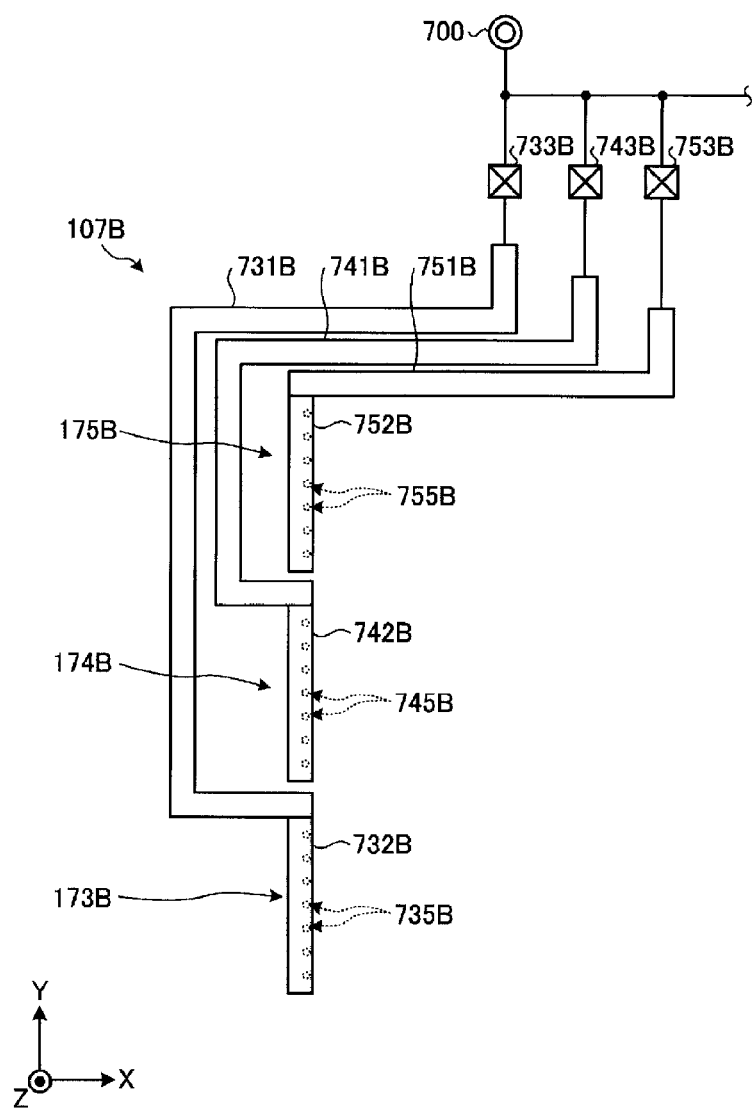
FIG. 8 is a plan view of the gas supply according to the second modification example of the first exemplary embodiment.

Hereinafter, modification examples of the gas supply 107 according to the first exemplary embodiment will be described with reference to FIG. 6 to FIG. 8. FIG. 6 is a side view of a gas supply according to a first modification example of the first exemplary embodiment. FIG. 7 is a side view of a gas supply according to a second modification example of the first exemplary embodiment. FIG. 8 is a plan view of the gas supply according to the second modification example of the first exemplary embodiment.

As illustrated in FIG. 6, a gas supply 107A according to the first modification example includes a third discharge path 173A and a fourth discharge path 174A placed above the third discharge path 173A. A second extension portion 732A of the third discharge path 173A includes a plurality of discharge openings 735A in a central region thereof in the arrangement direction of the plurality of wafers W. Further, a second extension portion 742A of the fourth discharge path 174A includes a plurality of discharge openings 745A in a front region in the arrangement direction of the plurality of wafers W and a plurality of discharge openings 746A in a back region in the arrangement direction of the plurality of wafers W.

With this configuration, it is possible to differentiate the discharge time and the flow rate of the nitrogen between the front and back regions and the central region in the arrangement direction of the plurality of wafers W.

As illustrated in FIG. 7 and FIG. 8, a gas supply 107B according to the second modification example includes a third discharge path 173B, a fourth discharge path 174B and a fifth discharge path 175B.

The third discharge path 173B includes a first extension portion 731B and a second extension portion 732B, and the first extension portion 731B is connected to the gas supply 700 via a flow rate controller 733B, and the second extension portion 732B includes a plurality of discharge openings 735B. The fourth discharge path 174B includes a first extension portion 741B and a second extension portion 742B, and the first extension portion 741B is connected to the gas supply 700 via a flow rate controller 743B, and the second extension portion 742B includes a plurality of discharge openings 745B. The fifth discharge path 175B includes a first extension portion 751B and a second extension portion 752B, and the first extension portion 751B is connected to the gas supply 700 via a flow rate controller 753B, and the second extension portion 752B includes a plurality of discharge openings 755B. The second extension portion 732B of the third discharge path 173B, the second extension portion 742B of the fourth discharge path 174B and the second extension portion 752B of the fifth discharge path 175B are arranged in this sequence along the arrangement direction of the plurality of wafers W.

With this configuration, it is possible to individually control the front region, the central region, and the back region in the arrangement direction of the plurality of wafers W.

Other Modification Examples of Gas Supply

In the first and second modification examples and the first exemplary embodiment, the innermost discharge path among the discharge paths arranged in a direction orthogonal to the arrangement direction of the plurality of wafers W is divided in the arrangement direction of the plurality of wafers W. However, the present disclosure is not limited thereto. The outermost discharge path or any other discharge path among the discharge paths arranged in the direction orthogonal to the arrangement direction of the plurality of wafers W may be divided in the arrangement direction of the plurality of wafers W.

Further, in the first and second modification examples and the first exemplary embodiment, some of the plurality of discharge paths arranged in the direction orthogonal to the arrangement direction of the plurality of wafers W are divided in the arrangement direction of the plurality of wafers W. However, the present disclosure is not limited thereto. All of the plurality of discharge paths arranged in the direction orthogonal to the arrangement direction of the plurality of wafers W may be divided in the arrangement direction of the plurality of wafers W.

Furthermore, in the first and second modification examples and the first exemplary embodiment, the discharge path divided in the arrangement direction of the plurality of wafers W is divided into two equal parts or three equal parts, but is not necessarily divided into equal parts.

Second Exemplary Embodiment

Figure 9:
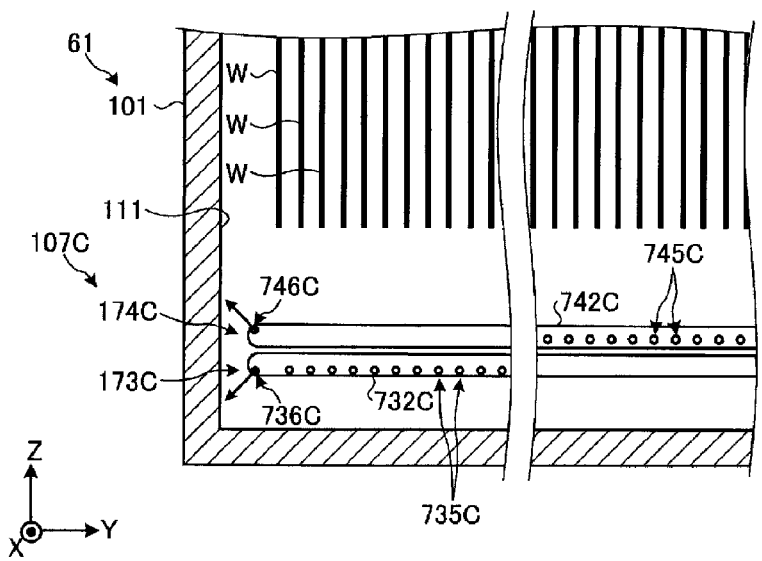
FIG. 9 is a side view of a gas supply according to a second exemplary embodiment.

Hereinafter, a configuration of a gas supply according to a second exemplary embodiment will be described with reference to FIG. 9. FIG. 9 is a side view of the gas supply according to the second exemplary embodiment.

As illustrated in FIG. 9, a gas supply 107C according to the second exemplary embodiment includes a third discharge path 173C and a fourth discharge path 174C placed above the third discharge path 173C.

A second extension portion 732C of the third discharge path 173C according to the second exemplary embodiment includes a discharge opening 736C through which the nitrogen is discharged toward an inner wall 111 of the inner tub 101. The discharge opening 736C is placed between the inner wall 111 and the first wafer W facing the inner wall 111 of the inner tub 101 in the arrangement direction of the plurality of wafers W.

Likewise, a second extension portion 742C of the fourth discharge path 174C according to the second exemplary embodiment includes a discharge opening 746C through which the nitrogen is discharged toward the inner wall 111 of the inner tub 101. The discharge opening 746C is placed between the inner wall 111 and the first wafer W facing the inner wall 111 of the inner tub 101 in the arrangement direction of the plurality of wafers W.

The liquid flow generated within the inner tub 101 may be different between a space between the inner wall 111 and the first wafer W facing the inner wall 111 of the inner tub 101 and a space between the wafers W. For example, an upward flow of the etching liquid may be generated between the wafers W, whereas a downward flow of the etching liquid may be generated between the first wafer W and the inner wall 111.

In this regard, the gas supply 107C according to the second exemplary embodiment includes the discharge openings 736C and 746c through which the nitrogen is discharged toward the inner wall 111 of the inner tub 101 and thus can suppress the downward flow from being generated between the first wafer W and the inner wall 111. Therefore, in the gas supply 107C according to the second exemplary embodiment, it is possible to suppress the bias of the liquid flow between the space between the inner wall 111 of the inner tub 101 and the first wafer W facing the inner wall 111 and the space between the wafers W.

In the second exemplary embodiment, the gas supply 107C includes the discharge openings 736C and 746c through which the nitrogen is discharged toward the inner wall 111 at the front side of the inner tub 101. However, the present disclosure is not limited thereto. The gas supply 107C may include a discharge opening for discharging the nitrogen toward an inner wall on the back side or a lateral side of the inner tub 101.

Third Exemplary Embodiment

Figure 10:
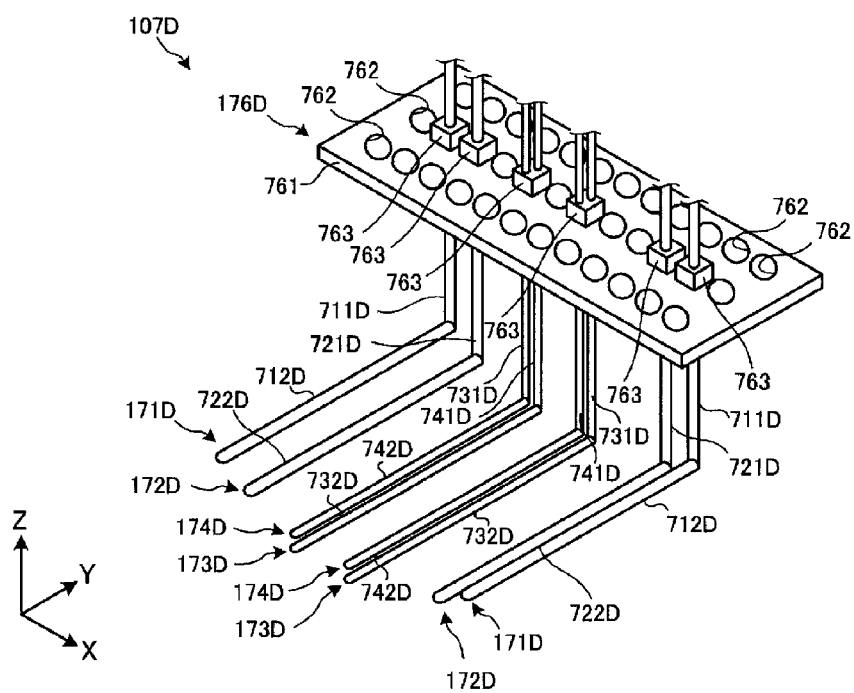
FIG. 10 is a perspective view of a gas supply according to a third exemplary embodiment.

Hereinafter, a configuration of a gas supply according to a third exemplary embodiment will be described with reference to FIG. 10. FIG. 10 is a perspective view of the gas supply according to the third exemplary embodiment.

As illustrated in FIG. 10, a gas supply 107D according to the third exemplary embodiment includes two first discharge paths 171D, two second discharge paths 172D, two third discharge paths 173D and two fourth discharge paths 174D. The first discharge path 171D, the second discharge path 172D, the third discharge path 173D and the fourth discharge path 174D include both first extension portions 711D, 721D, 731D and 741D and second extension portions 712D, 722D, 732D and 742D, respectively. The second extension portions 712D, 722D, 732D and 742D include a plurality of discharge openings (not illustrated herein). The discharge openings provided in the second extension portion 732D is placed corresponding to intervals of half the wafers W placed at the front side, and the discharge openings provided in the second extension portion 742D is placed corresponding to intervals of half the wafers W placed at the back side.

Further, the gas supply 107D according to the third exemplary embodiment includes a position adjuster 176D configured to adjust the positions of the first discharge paths 171D, the second discharge paths 172D, the third discharge paths 173D and the fourth discharge paths 174D.

The position adjuster 176D according to the third exemplary embodiment is equipped with a mounting plate 761. The mounting plate 761 includes a plurality of mounting holes 762. The plurality of mounting holes 762 is arranged in, e.g., the arrangement direction of the plurality of wafers W and in the direction orthogonal to the same arrangement direction. Each of the mounting holes 762 has a size capable of allowing the first extension portions 711D, 721D, 731D and 741D to pass therethrough. Therefore, the first to fourth discharge paths 171D to 174D can be mounted at any positions on the mounting plate 761. Further, each of the mounting holes 762 is capable of allowing the first extension portion 731D of the third discharge path 173D to pass therethrough together with the first extension portion 741D of the fourth discharge path 174D.

The position adjuster 176D also includes fixing members 763 configured to fix the first extension portions 711D, 721D, 731D and 741D into the mounting holes 762, respectively.

As described above, the gas supply 107D according to the third exemplary embodiment includes the position adjuster 176D and thus can adjust the positions of the first discharge paths 171D, the second discharge paths 172D, the third discharge paths 173D and the fourth discharge paths 174D. Therefore, it is possible to optimize the placement of the first discharge paths 171D, the second discharge paths 172D, the third discharge paths 173D and the fourth discharge paths 174D based on, e.g., a previously obtained result of the etching processing on the plurality of wafers W. Accordingly, the liquid flow of the etching liquid can be generated within the processing tub 61 and allows the etching processing to be performed on the plurality of wafers W in a more uniform manner.

Further, the fixing members 763 may be configured to fix the first extension portions 711D, 721D, 731D and 741D at a plurality of fixing positions in a vertical direction. With this configuration, the height positions of the first discharge paths 171D, the second discharge paths 172D, the third discharge paths 173D and the fourth discharge paths 174D can be adjusted.

Modification Examples of Position Adjuster

Figure 11:
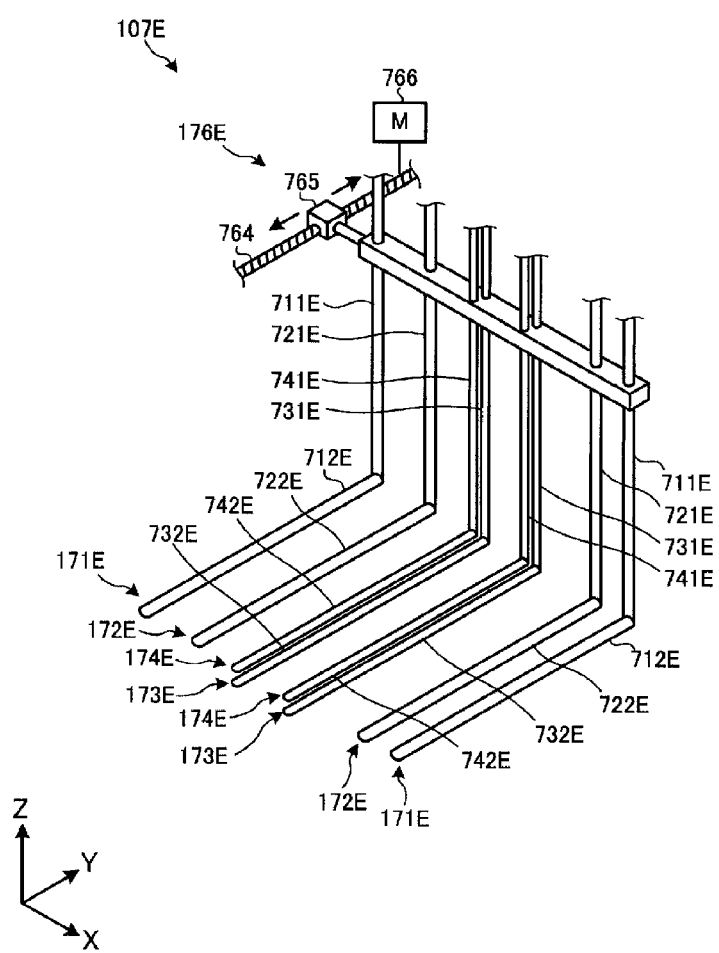
FIG. 11 is a perspective view illustrating a configuration of a position adjuster according to a first modification example of the third exemplary embodiment.
Figure 12:
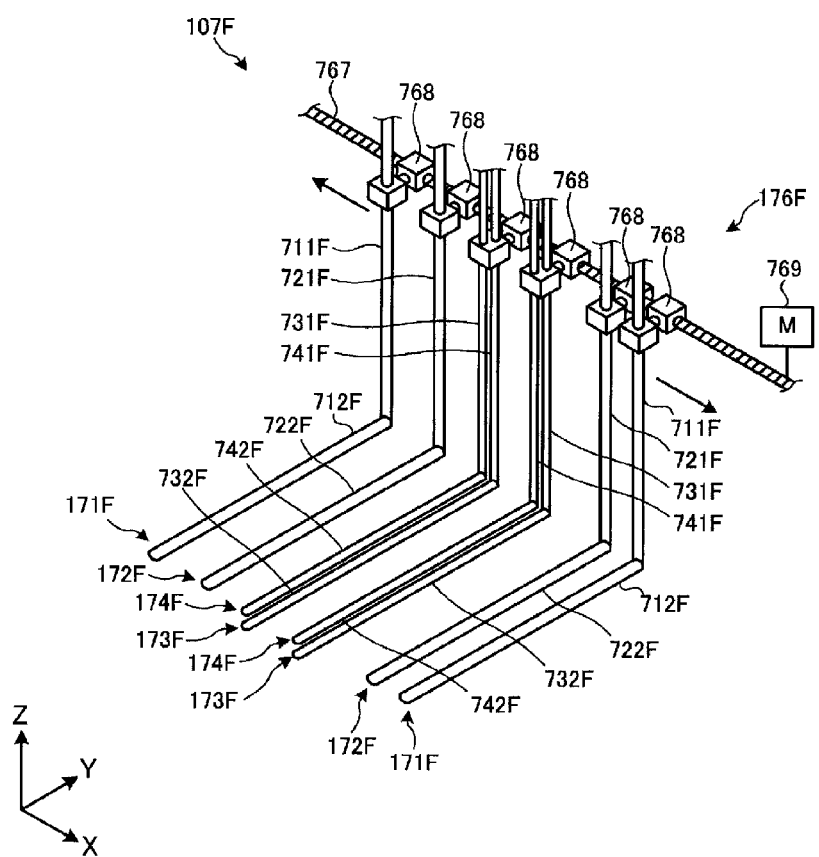
FIG. 12 is a perspective view illustrating a configuration of a position adjuster according to a second modification example of the third exemplary embodiment.

Hereinafter, modification examples of the position adjuster 176D will be described with reference to FIG. 11 and FIG. 12. FIG. 11 is a perspective view illustrating a configuration of a position adjuster according to a first modification example of the third exemplary embodiment. Further, FIG. 12 is a perspective view illustrating a configuration of a position adjuster according to a second modification example of the third exemplary embodiment.

As illustrated in FIG. 11, a gas supply 107E according to the first modification example of the third exemplary embodiment includes a position adjuster 176E. The position adjuster 176E includes a screw shaft 764, a holder 765 and a driver 766. The holder 765 is configured to hold two first discharge paths 171E, two second discharge paths 172E, two third discharge paths 173E and two fourth discharge paths 174E.

The screw shaft 764 and the driver 766 are an example of a moving mechanism configured to move the holder 765. The screw shaft 764 extends along the arrangement direction of the plurality of wafers W (Y-axis direction). The driver 766 is configured to move the holder 765 along the arrangement direction of the plurality of wafers W by rotating the screw shaft 764 around the axis thereof.

Although not illustrated in the drawings, the moving mechanism including the screw shaft 764 and the driver 766 is composed of a bearing configured to support the screw shaft 764, a guide rail configured to support the holder 765 to be movable in the arrangement direction of the plurality of wafers W, and the like.

The position adjuster 176E according to the first modification example moves the holder 765 using the screw shaft 764 and the driver 766. Accordingly, it is possible to move the two first discharge paths 171E, the two second discharge paths 172E, the two third discharge paths 173E and the two fourth discharge paths 174E along the arrangement direction of the plurality of wafers W.

Accordingly, the gas supply 107E according to the first modification example can optimize the placement of the two first discharge paths 171E, the two second discharge paths 172E, the two third discharge paths 173E and the two fourth discharge paths 174E in the arrangement direction of the plurality of wafers W. The optimization of the placement may be previously performed based on, e.g., the previously obtained result of the etching processing on the plurality of wafers W. That is, the positions of the two first discharge paths 171E, the two second discharge paths 172E, the two third discharge paths 173E and the two fourth discharge paths 174E in the arrangement direction of the plurality of wafers W may be adjusted to allow etching amounts of the plurality of wafers W to be uniform.

Further, the position adjustment by the position adjuster 176E may be performed during the etching processing. For example, the controller 7 may control the position adjuster 176E to change the discharge positions of the first to fourth discharge paths 171E to 174E in a state where the plurality of wafers W is immersed in the inner tub 101 and the nitrogen is discharged from the first to fourth discharge paths 171E to 174E. In this case, the controller 7 changes the discharge positions of the first to fourth discharge paths 171E to 174E by, e.g., a stroke smaller than a distance between the plurality of wafers W (e.g., a stroke equivalent to half the distance between the plurality of wafers W). The position adjustments of the first to fourth discharge paths 171E to 174E may be performed by reciprocating between two positions or the like.

As described above, the controller 7 may change the discharge positions of the first to fourth discharge paths 171E to 174E along the arrangement direction of the plurality of wafers W during the etching processing. Accordingly, it is possible to suppress the bias in the supply amount of the nitrogen, such as a case where some of the intervals among the plurality of wafers W are supplied with much nitrogen and the other intervals are supplied with little gas. Therefore, it is possible to promote the uniformity in the etching amount among the plurality of wafers W.

As illustrated in FIG. 12, a gas supply 107F according to the second modification example of the third exemplary embodiment includes a position adjuster 176F. The position adjuster 176F includes a screw shaft 767, a plurality of holders 768 and a driver 769. The plurality of (e.g., six) holders 768 is configured to hold a first discharge path 171F, a second discharge path 172F, a third discharge path 173F and a fourth discharge path 174F, a third discharge path 173F and a fourth discharge path 174F, a second discharge path 172F, and a first discharge path 171F, respectively. Further, the position adjuster 176F may include a single holder configured to hold all of the first to fourth discharge paths 171F to 174F.

The screw shaft 767 and the driver 769 are an example of a moving mechanism configured to move the plurality of holders 768. The screw shaft 767 extends along the direction (X-axis direction) orthogonal to the arrangement direction of the plurality of wafers W. The driver 769 is configured to move the plurality of holders 768 together along the direction orthogonal to the arrangement direction of the plurality of wafers W by rotating the screw shaft 767 around the axis thereof.

The position adjuster 176F according to the second modification example moves the plurality of holders 768 using the screw shaft 767 and the driver 769. Accordingly, it is possible to move the two first discharge paths 171F, the two second discharge paths 172F, the two third discharge paths 173F and the two fourth discharge paths 174F along the direction orthogonal to the arrangement direction of the plurality of wafers W.

Accordingly, the gas supply 107F according to the second modification example can optimize the placement of the first to fourth discharge paths 171F to 174F in the direction orthogonal to the arrangement direction of the plurality of wafers W.

The position adjustment by the position adjuster 176F may be performed previously based on the previously obtained result of the etching processing on the plurality of wafers W or performed during the etching processing. For example, if the position adjustment is performed during the etching processing, the controller 7 may control the position adjuster 176F to change the discharge positions of the first to fourth discharge paths 171F to 174F in a state where the plurality of wafers W is immersed in the inner tub 101 and the nitrogen is discharged from the first to fourth discharge paths 171F to 174F.

As described above, the controller 7 may change the discharge positions of the first to fourth discharge paths 171F to 174F along the direction orthogonal to the arrangement direction of the plurality of wafers W during the etching processing. Accordingly, it is possible to suppress the bias in the supply amount of the nitrogen within the surface of a single sheet of wafer W. Therefore, it is possible to promote the uniformity in the etching amount in the surface of the wafer W.

In the first modification example, the position adjuster 176E moves the first to fourth discharge paths 171E to 174E all at once. However, the position adjuster 176E may be configured to move the first to fourth discharge paths 171E to 174E individually. In this case, the gas supply 107E just needs to include a moving mechanism configured to hold and move the first discharge paths 171E, a moving mechanism configured to hold and move the second discharge paths 172E and a moving mechanism configured to hold and move the third discharge paths 173E and the fourth discharge paths 174E. The same can be applied to the second modification example. That is, the gas supply 107F just needs to include a moving mechanism configured to hold and move the first discharge paths 171F, a moving mechanism configured to hold and move the second discharge paths 172F and a moving mechanism configured to hold and move the third discharge paths 173F and the fourth discharge paths 174F.

Fourth Exemplary Embodiment

Figure 13:
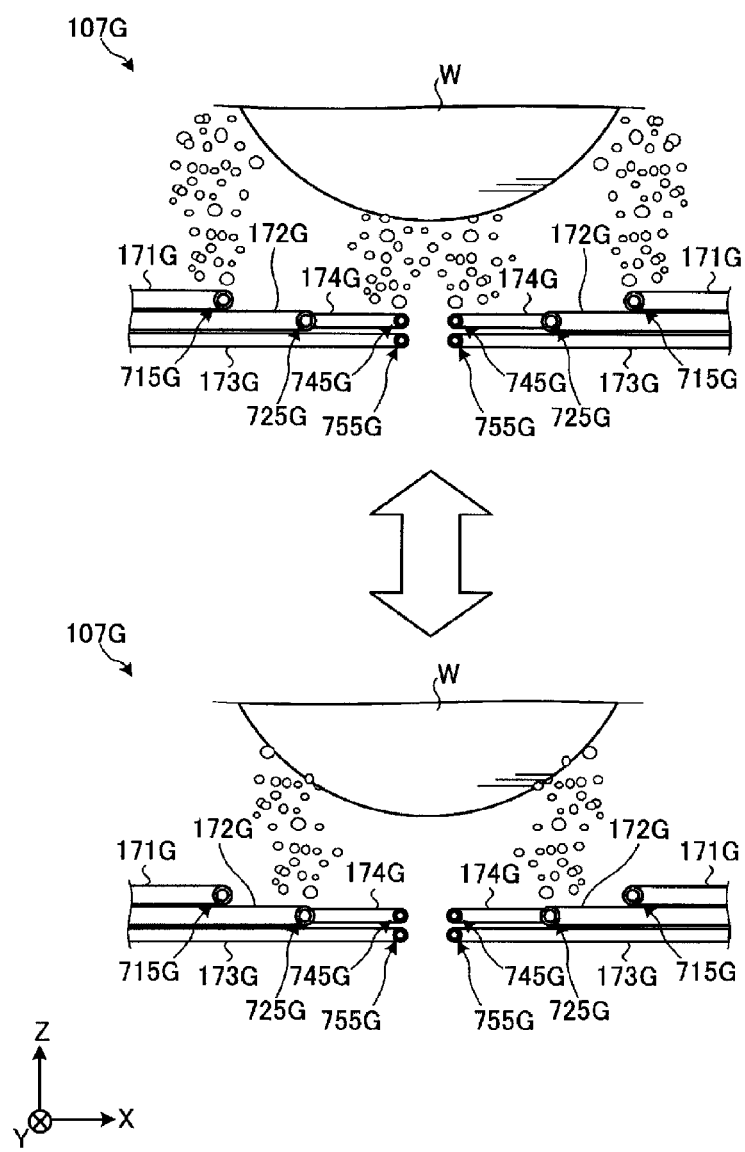
FIG. 13 is a cross-sectional view of a gas supply according to a fourth exemplary embodiment.

Hereinafter, a configuration of a gas supply according to a fourth exemplary embodiment will be described with reference to FIG. 13. FIG. 13 is a cross-sectional view of the gas supply according to the fourth exemplary embodiment. A gas supply 107G illustrated in FIG. 13 includes first to fourth discharge paths 171G to 174G that are the same as the first to fourth discharge paths 171 to 174 according to the first exemplary embodiment, but may include first to fourth discharge paths that are the same as those according to another exemplary embodiment.

As illustrated in FIG. 13, the controller 7 may control the flow rate controllers 713 to 714 (see FIG. 3) to switch between a first discharge state shown in the upper drawing of FIG. 13 and a second discharge state shown in the lower drawing of FIG. 13. The first discharge state refers to a state where the nitrogen is discharged from some, i.e., two first discharge paths 171G, two third discharge paths 173G and two fourth discharge paths 174G, of the first to fourth discharge paths 171G to 174G. The second discharge state refers to a state where the nitrogen is discharged from two second discharge paths 172G.

As described above, the controller 7 may switch between the first discharge state where the nitrogen is discharged from some of the first to fourth discharge paths 171G to 174G and the second discharge state where the nitrogen is discharged from the other discharge paths. Accordingly, it is possible to promote the uniformity in the etching amount within the surface of the wafer W. Further, the switching operation between the first discharge state and the second discharge state may be performed only once or several times during the etching processing.

Fifth Exemplary Embodiment

Figure 14:
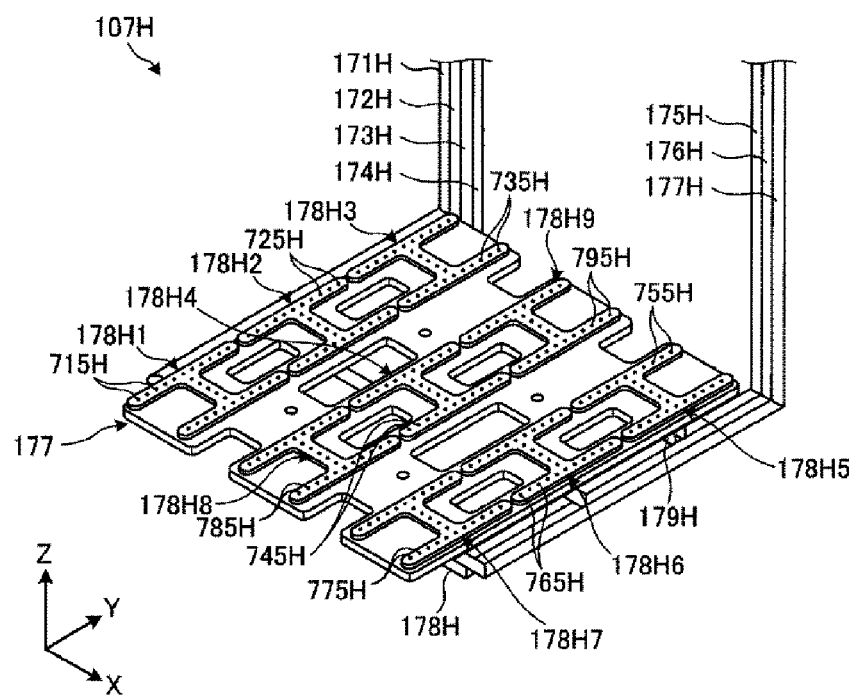
FIG. 14 is a perspective view of a gas supply according to a fifth exemplary embodiment as viewed from above.

Hereinafter, a configuration of a gas supply according to a fifth exemplary embodiment will be described with reference to FIG. 14 and FIG. 15. FIG. 14 is a perspective view of the gas supply according to a fifth exemplary embodiment as viewed from above. Further, FIG. 15 is a perspective view of the gas supply according to the fifth exemplary embodiment as viewed from below.

Figure 15:
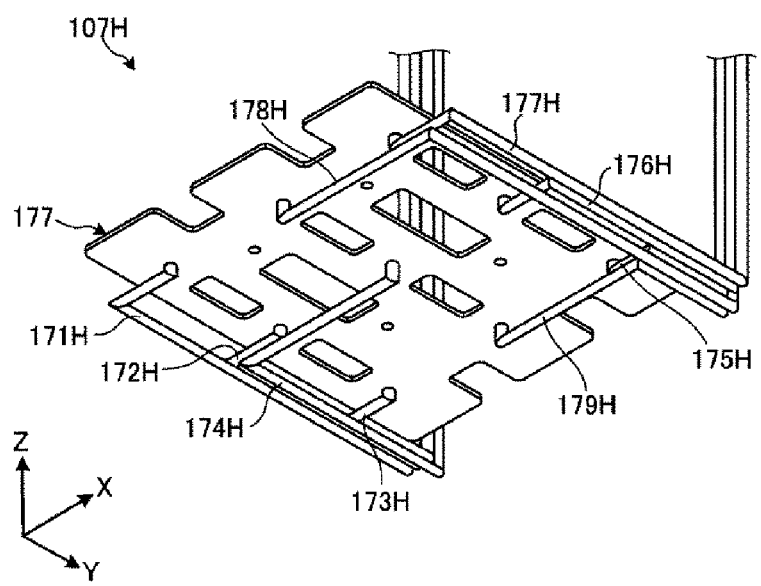
FIG. 15 is a perspective view of the gas supply according to the fifth exemplary embodiment as viewed from below.

As illustrated in FIG. 14 and FIG. 15, a gas supply 107H according to the fifth exemplary embodiment includes first to ninth discharge paths 171H to 179H and a discharge plate 177. The discharge plate 177 includes a plurality of (e.g., nine) discharge regions 178H1 to 178H9 that is partitioned from each other.

The discharge regions 178H1 to 178H9 are connected to the first to ninth discharge paths 171H to 179H, respectively. A plurality of discharge openings 715H is formed on a top surface of the discharge region 178H1, a plurality of discharge openings 725H is formed on a top surface of the discharge region 178H2, and a plurality of discharge openings 735H is formed on a top surface of the discharge region 178H3. Further, a plurality of discharge openings 745H is formed on a top surface of the discharge region 178H4, a plurality of discharge openings 755H is formed on a top surface of the discharge region 178H5, and a plurality of discharge openings 765H is formed on a top surface of the discharge region 178H6. Furthermore, a plurality of discharge openings 775H is formed on a top surface of the discharge region 178H7, a plurality of discharge openings 785H is formed on a top surface of the discharge region 178H8, and a plurality of discharge openings 795H is formed on a top surface of the discharge region 178H9.

The discharge regions 178H1 to 178H9 are arranged in, e.g., a 3×3 matrix form in the discharge plate 177. Specifically, the discharge regions 178H1, 178H2 and 178H3 are arranged along the arrangement direction of the plurality of wafers W and the discharge regions 178H8, 178H4 and 178H9 are arranged along the arrangement direction of the plurality of wafers W. Further, the discharge regions 178H7, 178H6 and 178H5 are arranged along the arrangement direction of the plurality of wafers W.

As described above, a region under the plurality of wafers W is divided into the plurality of (e.g., nine) discharge regions 178H1 to 178H9, and, thus, the gas supply 107H according to the fifth exemplary embodiment can control the discharge time and the flow rate of the nitrogen for each of the discharge regions 178H1 to 178H9. For example, the controller 7 can control at least one of the discharge time and the flow rate of the nitrogen for the discharge regions 178H1 to 178H9 based on the previously obtained result of the etching processing on the plurality of wafers W.

The discharge plate 177 can be detached from the first to ninth discharge paths 171H to 179H. Therefore, it is possible to select the most suitable one of a plurality of discharge plates 177, which is different from each other in the arrangement and the shape of the discharge regions 178H1 to 178H9, according to, e.g., the previously obtained result of the etching processing on the plurality of wafers W. Accordingly, it is possible to newly promote the uniformity in the etching processing among the plurality of wafers W.

The discharge plate 177 according to the fifth exemplary embodiment may include discharge openings for discharging the nitrogen toward the inner wall 111 of the inner tub 101 as provided in the gas supply 107C according to the second exemplary embodiment. In this case, the discharge openings for discharging the nitrogen toward the inner wall 111 may be provided in, e.g., the discharge regions 178H1, 178H7 and 178H8. Further, like the gas supplies 107E and 107F according to the third exemplary embodiment, the gas supply 107H according to the fifth exemplary embodiment may include a moving mechanism configured to move the first to ninth discharge paths 171H to 179H.

Other Exemplary Embodiments

In the above-described exemplary embodiments, the gas supplies 107 and 107A to 107H discharge the gas such as nitrogen or the like. However, the present disclosure is not limited thereto. The gas supplies 107 and 107A to 107H may discharge a liquid.

As described above, the substrate processing apparatus 1 according to the exemplary embodiments includes the processing tub 61 and a fluid supply (e.g., gas supplies 107 and 107A to 107H). In the processing tub 61, a processing (e.g., etching processing) is performed on a plurality of substrates (e.g., wafers W) by immersing them in a processing liquid (e.g., etching liquid). The fluid supply is disposed under the plurality of substrates within the processing tub 61 and configured to discharge a fluid (e.g., nitrogen) to generate a liquid flow of the processing liquid within the processing tub 61. Further, the fluid supply includes a plurality of discharge paths (e.g., third discharge paths 173 and 173A to 173G, fourth discharge paths 174 and 174A to 174G, and first to ninth discharge paths 171H to 179H) configured to discharge the fluid to different regions in an arrangement direction of the plurality of substrates.

Since the plurality of discharge paths configured to discharge the fluid to the different regions in the arrangement direction of the plurality of substrates is provided, a more appropriate liquid flow can be generated within the processing tub 61, as compared with the case where the fluid is discharged for the same discharge time at the same discharge flow rate in the arrangement direction of the plurality of substrates.

The fluid supply (e.g., gas supplies 107 and 107A to 107H) may supply a gas as the fluid. When the fluid supply supplies the gas, as the fluid, into the processing tub 61, the liquid flow of the processing liquid can be generated within the processing tub 61. Accordingly, it is possible to promote the uniformity in the processings among the substrates and the uniformity in the processing within the surface of the substrate. It is also possible to promote the uniformity in the temperature of the processing liquid.

The fluid supply (e.g., gas supplies 107 and 107A to 107H) may include additional discharge paths (e.g., first discharge paths 171 and 171A to 171H and second discharge paths 172 and 172A to 172H). The additional discharge paths are disposed in parallel to the plurality of discharge paths in a direction orthogonal to the arrangement direction of the plurality of substrates to discharge the fluid. In this case, inner diameters of the plurality of discharge paths may be smaller than those of the additional discharge paths.

Accordingly, it is possible to allow a pressure loss of the plurality of discharge paths to be higher than a pressure loss of the additional discharge paths. For this reason, the fluid can be discharged at a lower flow rate from the plurality of discharge paths. In other words, the minimum flow rate of the fluid from the plurality of discharge paths can be set low. Therefore, it is possible to more precisely control the liquid flow of the processing liquid.

The fluid supply (e.g., gas supply 107H) may be equipped with the discharge plate 177. The discharge plate 177 includes a plurality of discharge regions (e.g., discharge regions 178H1 to 178H9) partitioned from each other. Further, each of the plurality of discharge regions includes a plurality of discharge openings (e.g., discharge openings 715H, 725H, 735H, 745H, 755H, 765H, 775H, 785H and 795H), and is connected to a corresponding discharge path of the plurality of discharge paths. Accordingly, it is possible to control the discharge time and the flow rate of the fluid for each of the discharge regions. Further, it is possible to select the most suitable one of a plurality of discharge plates, which is different from each other in the arrangement and the shape of the discharge regions, according to, e.g., the previously obtained result of the processing on the plurality of substrates. Accordingly, it is possible to newly promote the uniformity in the substrate processing.

The substrate processing apparatus 1 according to the exemplary embodiment may include a moving mechanism (e.g., position adjusters 176E and 176F) for moving the plurality of discharge paths (e.g., first to fourth discharge paths 171E to 174E and first to fourth discharge paths 171F to 174F).

Accordingly, it is possible to optimize the arrangement of the plurality of discharge paths in the arrangement direction of the plurality of substrates. For example, the positions of the plurality of discharge paths in the arrangement direction of the plurality of substrates may be adjusted to perform the processing on the plurality of substrates in a uniform manner.

The fluid supply (e.g., gas supply 107C) may include discharge openings (e.g., discharge openings 736C and 746C) through which the fluid is discharged toward the inner wall 111 of the processing tub 61. Accordingly, it is possible to suppress the downward flow generated between the first substrate and the inner wall 111. Therefore, it is possible to suppress the bias of the liquid flow between the space between the inner wall 111 and the first substrate facing the inner wall 111 and the space between the wafers.

The fluid supply (e.g., gas supply 107D) may be equipped with the mounting plate 761 on which the discharge paths are mounted. The mounting plate 761 includes the plurality of mounting holes 762, and each of the discharge paths is mounted on any one of the plurality of mounting holes 762. Therefore, it is possible to optimize the arrangement of the plurality of discharge paths based on, e.g., the previously obtained result of the processing on the plurality of substrates. Accordingly, the liquid flow of the processing liquid can be generated within the processing tub 61 and allows the processing to be performed on the plurality of substrates in a more uniform manner.

A substrate processing apparatus according to the exemplary embodiment includes the processing tub 61, a fluid supply (e.g., gas supplies 107 and 107A to 107H) and the controller 7. In the processing tub 61, a processing (e.g., etching processing) is performed on a plurality of substrates (e.g., wafers W) by immersing them in a processing liquid (e.g., etching liquid). The fluid supply is disposed under the plurality of substrates within the processing tub 61 and configured to discharge a fluid (e.g., nitrogen) to generate a liquid flow of the processing liquid within the processing tub 61. The controller 7 controls at least one of the discharge time and the flow rate of the fluid discharged from the discharge supply. Further, the fluid supply includes a plurality of discharge paths (e.g., third discharge paths 173 and 173A to 173G, fourth discharge paths 174 and 174A to 174G, and first to ninth discharge paths 171H to 179H) configured to discharge the fluid to different regions in the arrangement direction of the plurality of substrates.

Since the plurality of discharge paths configured to discharge the fluid to the different regions in the arrangement direction of the plurality of substrates is provided, a more appropriate liquid flow can be generated within the processing tub 61, as compared with the case where the fluid is discharged for the same discharge time at the same discharge flow rate in the arrangement direction of the plurality of substrates. Further, since the controller individually controls the discharge time and the flow rate of the fluid discharged from the plurality of discharge paths, the liquid flow within the processing tub 61 can be controlled more appropriately.

The substrate processing apparatus 1 according to the exemplary embodiment may include a moving mechanism (e.g., position adjusters 176E and 176F) configured to move the plurality of discharge paths (e.g., first to fourth discharge paths 171E to 174E and first to fourth discharge paths 171F to 174F). In this case, the controller 7 may change the discharge positions of the plurality of discharge paths by controlling the moving mechanism to move the plurality of discharge paths in a state where the plurality of substrates is immersed in the processing tub 61 and the fluid is discharged from the plurality of discharge paths.

As described above, it is possible to promote the uniformity in the processing among the plurality of substrates or the uniformity in the processing within the surface of the substrate by moving the plurality of discharge paths with the moving mechanism during the processing on the plurality of substrates.

The moving mechanism (e.g., position adjuster 176E) may move the plurality of discharge paths (e.g., gas supply 107E) along the arrangement direction of the plurality of substrates.

Accordingly, it is possible to suppress the bias in the supply amount of the fluid, such as a case where some of intervals among the plurality of substrates are supplied with much fluid and the other intervals are supplied with little fluid. Therefore, it is possible to promote the uniformity in the processing among the plurality of substrates.

The controller 7 may move the plurality of discharge paths by a stroke smaller than a distance between the plurality of substrates. Accordingly, it is possible to suppress the bias in the supply amount of the fluid among the plurality of substrates.

According to the exemplary embodiments, it is possible to generate the appropriate liquid flow within the processing tub.

The exemplary embodiments disclosed herein are illustrative in all aspects and not limited thereto. In fact, the above exemplary embodiments can be embodied in various forms. Further, the above-described exemplary embodiments may be omitted, substituted, or changed in various forms without departing from the scope of the appended claims.

From the foregoing, it will be appreciated that various exemplary embodiments of the present disclosure have been described herein for the purposes of illustration, and that various modifications may be made without departing from the scope and spirit of the present disclosure. Accordingly, the various exemplary embodiments disclosed herein are not intended to be limiting, with the true scope and spirit being indicated by the following claims.

We claim:

1. A substrate processing apparatus, comprising:
   a processing tub in which a processing is performed on multiple substrates; and
   a fluid supply disposed under the multiple substrates within the processing tub and configured to discharge a fluid within the processing tub,
   wherein the fluid supply includes multiple discharge paths including a first discharge path having a first plurality of discharge openings and a second discharge path having a second plurality of discharge openings,
   the first plurality of discharge openings provided in the first discharge path are arranged at a front side of the processing tub, and
   the second plurality of discharge openings provided in the second discharge path are arranged at a back side of the processing tub,
   wherein the fluid supply includes additional discharge paths configured to discharge the fluid and disposed in parallel to the multiple discharge paths in a direction orthogonal to the arrangement direction of the multiple substrates, and
   inner diameters of the multiple discharge paths are smaller than those of the additional discharge paths, wherein both of the multiple discharge paths and the additional discharge paths are connected to a same fluid source configured to supply the fluid.

2. The substrate processing apparatus of claim 1, wherein the fluid supply supplies a gas as the fluid.

3. The substrate processing apparatus of claim 2,
wherein the fluid supply is equipped with a discharge plate including multiple discharge regions partitioned from each other, and
each of the multiple discharge regions includes multiple discharge openings and is connected to a corresponding one of the multiple discharge paths.

4. The substrate processing apparatus of claim 3, further comprising:
a moving mechanism configured to move the multiple discharge paths.

5. The substrate processing apparatus of claim 4,
wherein the fluid supply includes a discharge opening through which the fluid is discharged toward an inner wall of the processing tub.

6. The substrate processing apparatus of claim 5,
wherein the fluid supply is equipped with a mounting plate on which the multiple discharge paths are mounted, and
the mounting plate includes multiple mounting holes, and each of the multiple discharge paths is mounted on a corresponding one of the multiple mounting holes.

7. The substrate processing apparatus of claim 1,
wherein the fluid supply is equipped with a discharge plate including multiple discharge regions partitioned from each other, and
each of the multiple discharge regions includes multiple discharge openings and is connected to a corresponding one of the multiple discharge paths.

8. The substrate processing apparatus of claim 1, further comprising:
a moving mechanism configured to move the multiple discharge paths.

9. The substrate processing apparatus of claim 1,
wherein the fluid supply further includes a discharge opening through which the fluid is discharged toward an inner wall of the processing tub.

10. The substrate processing apparatus of claim 1,
wherein the fluid supply is equipped with a mounting plate on which the multiple discharge paths are mounted, and
the mounting plate includes multiple mounting holes, and each of the multiple discharge paths is mounted on a corresponding one of the multiple mounting holes.

11. A substrate processing apparatus, comprising:
a processing tub in which a processing is performed on multiple substrates;
a fluid supply disposed under the multiple substrates within the processing tub and configured to discharge a fluid within the processing tub; and
a controller configured to control at least one of a discharge time or a flow rate or both of the fluid discharged from the fluid supply,
wherein the fluid supply includes multiple discharge paths including a first discharge path having a first plurality of discharge openings and a second discharge path having a second plurality of discharge openings,
the first plurality of discharge openings provided in the first discharge path are arranged at a front side of the processing tub, and
the second plurality of discharge openings provided in the second discharge path are arranged at a back side of the processing tub,
wherein the fluid supply includes additional discharge paths configured to discharge the fluid and disposed in parallel to the multiple discharge paths in a direction orthogonal to the arrangement direction of the multiple substrates, and
inner diameters of the multiple discharge paths are smaller than those of the additional discharge paths,
wherein both of the multiple discharge paths and the additional discharge paths are connected to a same fluid source configured to supply the fluid.

12. The substrate processing apparatus of claim 11, further comprising:
a moving mechanism configured to move the multiple discharge paths,
wherein the controller changes discharge positions of the multiple discharge paths by controlling the moving mechanism to move the multiple discharge paths in a state where the multiple substrates are immersed in the processing tub and the fluid is discharged from the multiple discharge paths.

13. The substrate processing apparatus of claim 12,
wherein the moving mechanism moves the multiple discharge paths along the arrangement direction of the multiple substrates.

14. The substrate processing apparatus of claim 10,
wherein the controller moves the multiple discharge paths by a stroke smaller than a distance between the multiple substrates.

* * * * *

UNITED STATES PATENT AND TRADEMARK OFFICE
CERTIFICATE OF CORRECTION

| | | |
|---|---|---|
| PATENT NO. | : 11,742,223 B2 | Page 1 of 1 |
| APPLICATION NO. | : 16/737027 | |
| DATED | : August 29, 2023 | |
| INVENTOR(S) | : Yuji Kimura et al. | |

It is certified that error appears in the above-identified patent and that said Letters Patent is hereby corrected as shown below:

In the Specification

Column 11, Line 21, "1756" should be -- 175B --.

Signed and Sealed this
First Day of October, 2024

Katherine Kelly Vidal
*Director of the United States Patent and Trademark Office*